Feb. 22, 1966 F. C. FITZGERALD 3,237,019

ELECTRONIC CLAMPING CIRCUIT

Filed June 28, 1961

INVENTOR

FREDRIC C. FITZGERALD

BY Ralph R Barnard

ATTORNEY 3,237,019
Patented Feb. 22, 1966

3,237,019
ELECTRONIC CLAMPING CIRCUIT

Fredric C. Fitzgerald, Endicott, N.Y., assignor to International Business Machines Corporation, New York, N.Y., a corporation of New York Filed June 28, 1961, Ser. No. 120,220
3 Claims. (Cl. 307—88.5)

The present invention relates to electronic clamping circuits and more particularly to a new and improved diode clamping circuit wherein the voltage droop is minimized at the unclamped voltage level.

Clamping circuits have wide utility in the electronic arts, particularly whenever capacitor coupling is employed between stages of electronic circuits. For example, electronic clamping is utilized in radar, radio and digital data processing systems to maintain voltage levels. As those skilled in the art know, a voltage waveform will pass through a capacitor when the rate of change of that voltage exceeds the charging or discharging rate of the capacitor as it adjusts to the average voltage level being applied thereto. While diode clamping may be employed to determine one voltage level of a rectangular voltage waveform being passed through a capacitor, the other voltage level of the voltage waveform will tend to be modified by the charging and discharging of the capacitor as determined by the magnitude of the voltage applied to capacitor and the RC time constant of the charging or discharge circuit. This is known as voltage droop.

When the capacitive coupling and clamping circuit are being used to transmit the voltage waveform to a transistor circuit, added problems arise as a result of the need for biasing of the transistor to its operating point. Specifically, the selection of the RC time constant of the charging and discharging path of the capacitor when the output voltage waveform is at its unclamped voltage level is adversely constrained by the need for both a clamp bias voltage source and the need for biasing the transistor at its operating point.

It is therefore a primary object of the present invention to provide a new and improved diode clamping circuit for use with capacitive coupling wherein the voltage droop during the unclamped voltage level is minimized.

Still another object of the present invention is to provide a new and improved diode clamping circuit for use with capacitive coupling wherein the voltage droop is minimized for the unclamped voltage level by utilizing the biasing voltage and reflected load resistance of a transistor stage connected thereto as a part of the clamping circuit.

It is another object of the present invention to provide a new and improved diode clamping circuit for use with capacitive coupling to a transistor circuit wherein the voltage droop is minimized for the unclamped voltage level because the biasing voltage for the diode clamp is small and yet the resistance in the discharge and charging path is large when the output voltage waveform is at its unclamped voltage level.

Briefly, the foregoing objects of the present invention are obtained by utilizing the emitter biasing voltage of a transistor connected in an emitter follower configuration to provide the clamp bias voltage for a diode clamping circuit when the input voltage waveform equals or exceeds the clamped voltage level and utilizing the high reflected resistance of the emitter biasing resistor to minimize the voltage droop when the output voltage waveform is at its unclamped voltage level.

The foregoing and other objects, features and advantages of the invention will be apparent from the following more particular description of preferred embodiments of the invention, as illustrated in the accompanying drawings.

Figure 1:
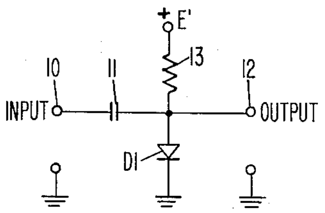
FIG. 1 PRIOR ART
FIG. 1 shows a diode clamping circuit of the prior art.
Figure 2A:
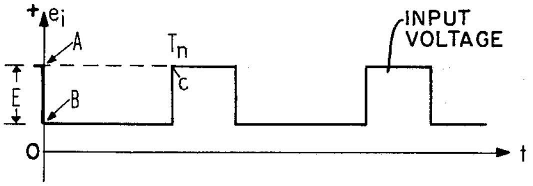
FIG. 2A shows a voltage waveform being applied to the input terminals of some of the clamping circuits shown in the figures.

In order to emphasize the teachings of the present invention FIG. 1 shows a prior art electrical diode clamping circuit containing capacitor 11 through which it is desired to pass a rectangular voltage waveform such as that shown in FIG. 2A. On the change of the voltage level applied to the capacitor the voltage drop across the capacitor can change only as fast as the charge on the capacitor can change. The charging or discharging current is an exponential function and its instantaneous magnitude is determined by the magnitude of the change in voltage level and the time constant of the discharging or charging path. When voltage level changes exceed the rate of change at which the voltage drop across the capacitor can adjust, that varying voltage is effectively passed through the capacitor. Moreover, the D.C. voltage level of the input waveform is not maintained on the output side of the capacitor.

FIG. 1 shows a prior art circuit used for the purpose of passing rectangular voltage waveforms with a good low frequency response and at the same time control the D.C. voltage level of the output waveform. Terminal 10 serves as an input for the voltage waveform of FIG. 2A. Terminal 12 serves as the output terminal for the voltage waveform shown in FIG. 2B. The output terminal 12 connected to capacitor 11 is also connected through clamping diode D1 to ground (or some other reference voltage), as shown. Also connected to the common terminal of the diode D1 and the capacitor 11 is a clamp load resistor 13 of a resistance R energized at its remote extremity by a clamp quiescent supply voltage E′.

The resistance R of resistor 13 is usually selected to be much greater than the resistance R*f* of the forward biased diode D1 ($R>>Rf$). On the other hand the resistance R of resistor 13 is selected to be much less than the resistance R*b* of the reverse biased diode D1 ($R<<Rb$).

Figure 2B:
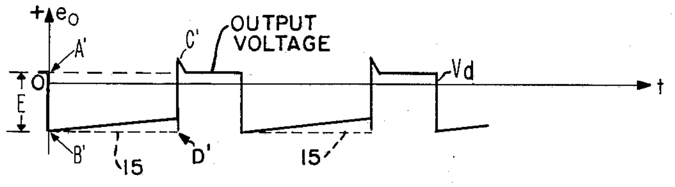
FIG. 2B shows the output waveform of some of the output terminals of the clamping circuits shown in the figures.

When the waveform of FIG. 2A is at its up level, point A, diode D1 is maintained in a conducting condition by voltage source E′ and the voltage across the capacitor C11 (and charge) adjust so that the voltage level at the output terminal is above ground by an amount equal to the voltage drop $V_d$ across the diode resistance R*f* which is small. FIG. 2B shows the waveform of the output voltage. Point A′ in FIG. 2B is at voltage $V_d$ above ground (the reference voltage). The voltage $V_d$ thus represents the clamped voltage level of the output voltage waveform.

At time $T=0$, when the voltage waveform of FIG. 2A swings in the negative direction by the amount E to its low voltage level point B, the charge on the capacitor cannot change rapidly enough and the voltage level at the output terminal 12 then swings in the negative direction by the amount E to the voltage level point B′. Since, as shown in FIGURES 2A and 2B, the voltage level change E in the negative direction is greater than the above ground clamped voltage level $V_d$ the diode D1 becomes back biased and is rendered nonconductive and the discharging and charging path for capacitor 11 then becomes the path from terminal 10 which has a voltage level change E applied thereto through capacitor 11, resistor 13 to source E′. Because the charging and discharging current is exponential and the voltage level at terminal 12 is determined by the current flow, that voltage is also an exponential. This exponential change in voltage at terminal 12 is known as a drooping action. This drooping action may be represented by the following mathematical expression:

$$e_o=(E'+E)(1-e^{-t/RC}) \quad (1)$$

Where:

$e_o$ equals the instantaneous magnitude of the voltage at output terminal 12;
E the voltage level change in the input voltage waveform;
E′ the clamp quiescent supply voltage E′;
R the resistance of resistor 13; and
C the capacitance of the capacitor 11.

As may be seen from an inspection of this relationship, increases in the magnitude of the voltage E′ are effective to increase the droop while increases in the magnitude of resistance R and capacitance C tend to decrease the droop. For a quantitative illustration of this relationship, RC product for a 10% of E can be represented as follows:

$$RC=\frac{Tn}{Ln\frac{(1+K2)}{.904+K2}} \quad (2)$$

Where:

$K2=E'/E$
T*n* represents the time at which the input voltage waveform of FIG. 2A remains at the unclamped voltage level.

For example, according to this expression, a $K2=45$ and a $Tn=3.6$ millisec. requires RC=700 millisec.

As will be noted from the waveform of FIG. 2B, the drooping action adversely affects the low frequency response of the clamping circuit and it is exceedingly desirable that it be minimized. However, as may be seen by the relationship, whenever the magnitude of the voltage E′ is modified the product of RC must be likewise modified. Since the size of the capacitance C must be limited for purposes of obtaining an efficient clamp capacitor charging when the voltage level of the input waveform is in its up level condition, the freedom of selection of the capacitor is thereby limited.

Figure 3:
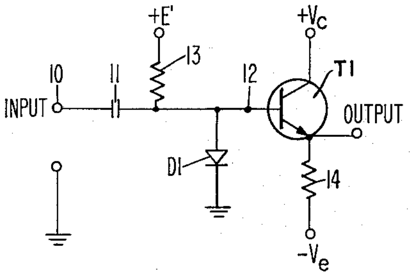
FIG. 3 PRIOR ART
FIG. 3 shows the prior art method for connecting the clamping circuit of FIG. 1 to a transistor emitter follower stage for the purpose of illustrating the shortcomings of the prior art diode clamping circuit.

In addition, because the output of the circuit of FIG. 1 will often be used to supply the waveform of FIG. 2A to a transistor circuit in the manner shown in FIG. 3, selection of the resistance R and the voltage E′ must be based on the D.C. bias considerations for that transistor circuit. Specifically referring to FIG. 3 output terminal 12 is connected to the base of transistor T1. NPN transistor T1 is connected to operate as an emitter follower. Connected to the emitter of transistor T1 is a resistor 14. The other extremity of resistor 14 is connected to an emitter bias voltage $-V_e$. The collector of transistor T1 is shown connected directly to a biasing source $+V_c$. Bias voltage $+V_c$ is selected so that the base collector junction is normally reverse biased. Bias voltage $-V_e$ is selected so that the base emitter junction is always forward biased.

When the input voltage waveform of FIG. 2A is at its up voltage level the clamping diode D1 is conducting and the conduction of the transistor is determined by the voltage at the base which in turn clamped by diode D1.

The voltage E′ and resistor 13 are selected so as to provide the transistor base current and the diode current when the diode is conducting. As set forth hereinabove the resistance R of resistor 13 has to be made larger and E′ made smaller to obtain a diminution of the droop. Yet when the particular level of current is required through resistor 13 any increase in its resistance value must be accompanied by a corresponding increase in E′. Accordingly, a dilemma exists in selecting the magnitude of the voltage E′ and resistance of resistor 13.

Figure 4:
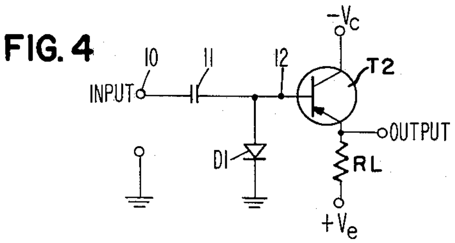
FIG. 4 shows an up voltage level clamping circuit connected with a transistor emitter follower stage utilizing the teachings of the present invention.

Recognizing this dilemma it is the fundamental teaching of the present invention to provide the source E′ and tue resistance R through the transistor. For example, referring to FIG. 4 by eliminating source E′ and resistor 13 using a PNP transistor T2 instead of NPN transistor T1 and properly selecting emitter resistor 14 to have a magnitude RL which in the base of the transistor T1 is equal to R (the resistance of resistor 13) by reason of the following relationship:

$$R=(\beta+1)RL \quad (3)$$

Where $\beta$ represents the current gain of transistor T1 in the circuit configuration of FIG. 4.

the dilemma may be overcome. In the circuit of FIG. 4, the charging and discharging path, when the output waveform of FIG. 2B goes to its unclamped voltage level is through the base emitter junction of the transistor to the source $+V_e$.

In this way the resistance of the charging and discharging path as seen by the capacitor is very large yet the equivalent voltage source E′ (provided by source $+V_e$ reflected into the base) is relatively small. The voltage droop at terminal 12 and the output of the transistor T2 are determined by the total resistance seen by the discharing capacitor. Although the equivalent resistance R determines the charge and discharge rate of the capacitor the output voltage is taken across only a small portion of the resistance in the charging and discharging path. It is only necessary that RL be selected so that sufficient current is present in the base to supply the leakage current of transistor during the clamped voltage level of the input voltage waveform at maximum operating temperature. This condition must be satisfied for a maximum operation temperature of the transistor to prevent an open base circuit and possible damage to the transistor. By utilizing the teachings of FIG. 4 the voltage droop illustrated in the output waveform of FIG. 2B may be minimized as shown by the broken lines 15. Thus, at time $T=0$ when input voltage $e_i$ applied to the circuit of FIGURE 4 swings instantaneously in the down direction by the amount E from point A to point B of FIGURE 2A, the output voltage $e_o$ at terminal 12 swings in the down direction from the positive clamp voltage level $V_d$ at point A′ to the negative voltage level at point B′ of FIGURE 2B. This output voltage swing at terminal 12 back-biases diode D1 rendering it nonconductive. Thus, capacitor 11 is connected into a charging and discharging circuit with the base emitter circuit of transistor T2, the resistor RL, and voltage source $+V_e$. Because of the high impedance of this circuit, the change in the charge of capacitor 11 is very slow during the time interval when the input voltage $e_i$ is at its low level B of FIGURE 2A, thereby resulting in the holding of the output voltage $e_o$ at terminal 12 at the low voltage level from point B′ along broken line 15 to point D′ of FIGURE 2B. Thus, voltage droop has been greatly minimized.

Figure 5:
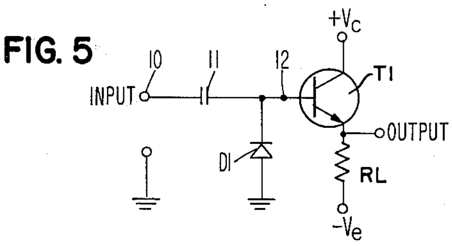
FIG. 5 shows a down voltage level clamping circuit connected with a transistor emitter follower stage utilizing the teachings of the present invention.

FIG. 4 shows a clamping circuit for the upper voltage level with a minimization of the voltage drooping present when the input waveform is in its down voltage level by utilizing the teachings of the present invention. It should be understood that the teachings of the present invention may be applied to a down voltage level clamping circuit by reversely orienting the diode D1 selecting an NPN transistor as T1 of FIGURE 3 and reversing the biasing voltages. Such a circuit is shown in FIG. 5. The clamped voltage level in either of the two embodiments is determined by the selection of the reference voltage level to which the diode is returned. Herein this voltage level was ground.

While the embodiments of FIGS. 4 and 5 show an emitter follower circuit connected to the clamping circuit, it should be clear that any active element current operated circuit could be used providing it reflected a high impedance to the capacitor and at the same time provides a small current to the conducting diode.

When the input wave form of FIG. 2A which is being applied to input terminal 10 changes from its low level to its high level as shown by point C the charge of the capacitor 11 cannot adjust quickly enough and the voltage at output terminal 12 (point C' of FIG. 2B) will be increased by the amount of the voltage change E. Whereupon clamping diode D1 returns to a forward bias condition and the charge of capacitor 11 adjusts through a charge path including diode D1. Since the resistance $R_f$ of diode D1 in its forward biased condition is very low the time required is very short for the adjustment of charge on capacitor 11 so that the voltage on the output terminal 12 goes to its clamp condition $V_d$.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A voltage clamping circuit having a good low frequency response comprising an input terminal, output terminal, a capacitor for coupling said input terminal with said output terminal, a reference voltage source, a diode connected between said output terminal side of said capacitor and said reference voltage, said diode being oriented to be reversely biased by an input voltage waveform being applied to said input terminal when that voltage decreases from its clamped voltage level, a continuously conducting transistor means connected in an emitter follower configuration, the base of said transistor means being connected to said output terminal, the base emitter circuit of said transistor means acting as a source of a small conducting current for said diode whenever the voltage output waveform at said output terminal is at its clamped voltage level and providing a high reflected impedance to said capacitor without regard to the magnitude of the voltage level at said output terminal.

2. A voltage clamping circuit having a good low frequency response comprising an input terminal, an output terminal, a capacitor for coupling said input terminal with said output terminal, a reference voltage source, a diode connected between said output terminal side of said capacitor and said reference voltage, said diode being oriented to be reversely biased by an input voltage waveform being applied to said input terminal when that voltage decreases from its clamped voltage level, a continuously conducting transistor means connected in an emitter follower configuration including an output resistance and a D.C. power supply in the emitter circuit, the base of said transistor means being connected to said output terminal, said base emitter circuit of said transistor means being operable as a source of small conducting current for said diode whenever the voltage output waveform at said output terminal is at its clamped voltage level and providing a high reflecting impedance to said capacitor without regard to the magnitude of the voltage level at said output terminal.

3. A voltage clamping circuit having a good low frequency response comprising an input terminal, an output terminal, a capacitor for coupling said input terminal with said output terminal, a reference voltage source, a diode connected between said output terminal side of said capacitor and said reference voltage, said diode being oriented to be reversely biased by an input voltage waveform being applied to said input terminal when it decreases from its clamped voltage level, a continuously conducting active element current operative circuit means connected to said output terminal for providing a source of a small conducting current for said diode whenever the voltage waveform at said output terminal is at its clamped voltage level and providing a high reflected impedance to said capacitor without regard to the magnitude of the voltage waveform at said output terminal.

References Cited by the Examiner

UNITED STATES PATENTS

| | | | |
|---|---|---|---|
| 2,923,863 | 2/1960 | Chesson et al. | 307—88.5 |
| 3,132,303 | 5/1964 | Rall | 307—88.5 X |
| 3,159,751 | 12/1964 | Bogdan et al. | 307—88.5 |

ARTHUR GAUSS, *Primary Examiner.*

GEORGE N. WESTBY, *Examiner.*